United States Patent [19]

Reczek et al.

[11] Patent Number: 5,041,894

[45] Date of Patent: Aug. 20, 1991

[54] INTEGRATED CIRCUIT WITH ANTI LATCH-UP CIRCUIT IN COMPLEMENTARY MOS CIRCUIT TECHNOLOGY

[75] Inventors: Werner Reczek, Munich; Wolfgang Pribyl, Ottobrunn, both of Fed. Rep. of Germany

[73] Assignee: Siemens Aktiengesellschaft, Munich, Fed. Rep. of Germany

[21] Appl. No.: 477,929

[22] PCT Filed: Oct. 24, 1988

[86] PCT No.: PCT/DE88/00651

§ 371 Date: Jun. 19, 1990

§ 102(e) Date: Jun. 19, 1990

[87] PCT Pub. No.: WO89/06048

PCT Pub. Date: Jun. 29, 1989

[30] Foreign Application Priority Data

Dec. 23, 1987 [DE] Fed. Rep. of Germany ....... 3743930

[51] Int. Cl.⁵ .................... H01L 27/02; H03K 3/01
[52] U.S. Cl. ............................. 357/42; 357/41; 357/86; 307/296.2; 307/296.8
[58] Field of Search ............ 357/41, 42, 21, 86; 307/296.2, 296.8

[56] References Cited

U.S. PATENT DOCUMENTS

| | | | |
|---|---|---|---|
| 4,446,384 | 5/1984 | Taira | 307/296.2 |
| 4,485,433 | 11/1984 | Topich | 307/296.2 |
| 4,491,746 | 1/1985 | Koike | 307/296.2 |
| 4,559,548 | 12/1985 | Iizuka et al. | 307/296.2 |
| 4,670,668 | 6/1987 | Liu | 307/296.2 |
| 4,670,669 | 6/1987 | Cottrell et al. | 307/296.2 |
| 4,740,715 | 4/1988 | Okada | 367/296.2 |
| 4,760,035 | 7/1988 | Pfleiderer et al. | 357/42 |
| 4,791,316 | 12/1988 | Winnerl et al. | 307/296.2 |
| 4,798,974 | 1/1989 | Reczek et al. | 307/296.2 |
| 4,817,055 | 3/1989 | Arakawa et al. | 307/296.2 |
| 4,991,317 | 12/1988 | Winnerl et al. | 307/296.2 |

FOREIGN PATENT DOCUMENTS

| | | |
|---|---|---|
| 3414772 | 10/1984 | Fed. Rep. of Germany ........ 357/42 |
| 58-225664 | 12/1983 | Japan. |
| 61-115349 | 6/1986 | Japan. |

OTHER PUBLICATIONS

B. B. M. Braudt et al., "LOCOMOS, A New Technology for Complementary MOS Circuits," Phillips Tech. Rev. 34, No. 1, 1974, pp. 19–23.

Healbleiterelektronik 14, H. Weiss, K. Horninger, "Intergrierte MOS-Schaltungen", pp. 109–112, 1982.

"Floating Well CMOS and Latch-Up", H. P. Zappe et al., IEDM 85, pp. 517–520, Dec. 9, 1985.

Primary Examiner—Andrew J. James
Assistant Examiner—Cynthia S. Deal
Attorney, Agent, or Firm—Hill, Van Santen, Steadman & Simpson

[57] ABSTRACT

The risk of a latch-up is diminished by the incorporation of an additional bypass transistor between the output (OUT) and the supply voltage ($V_{DD}$) of an integrated circuit, for example a CMOS output stage. In case positive over-voltages that are greater than the sum of the supply voltage ($V_{DD}$) and the conducting-state voltage of the bypass transistor occur at the output (OUT), the bypass transistor becomes conductive and represents a low-impedance connection between the output (OUT) and the supply voltage ($V_{DD}$). In this case, the bypass transistor (BT) suctions additional charge carriers off and thereby increases the trigger current needed for the appearance of latch-up. The incorporation of an additional bypases transistor is possible both given well-shaped semiconductor zones that lie at a fixed potential as well as given well-shaped semiconductor zones that are wired to a variable potential. FIG. 1

8 Claims, 2 Drawing Sheets

INTEGRATED CIRCUIT WITH ANTI LATCH-UP CIRCUIT IN COMPLEMENTARY MOS CIRCUIT TECHNOLOGY

BACKGROUND OF THE INVENTION

The invention is directed to an integrated circuit with anti latch-up circuit in complementary MOS circuit technology conforming to the preamble of patent claim 1.

In integrated circuits of this species in complementary MOS technology, parasitic pnpn paths between the supply voltage and the ground occur that are similar to a thyristor. This parasitic four-layer structure can be ignited by disturbances, for example by current pulses or by over-shoots or under-shoots of the applied supply voltage at the semiconductor layers. The switch from the normal condition into a highly conductive condition, i.e. the igniting of this four-layer structure, is referred to as latch-up.

For understanding the latch-up effect, it can be assumed that four successive semiconductor layers of alternating conductivity types are generally present between a terminal of a field effect transistor of the first channel type lying in a well-shaped semiconductor zone and a terminal of a field effect transistor of the second channel type placed outside of this zone on the semiconductor substrate, whereby the one terminal region of the former transistor forms the first semiconductor layer, the well-shaped semiconductor zone forms the second semiconductor layer, the semiconductor substrate forms the third semiconductor layer and the one terminal region of the latter transistor forms the fourth semiconductor layer. Due to this structure, a parasitic bipolar pnp transistor and an npn transistor derive. The collector of the pnp bipolar transistor corresponds to the base of the npn bipolar transistor and the base of the pnp bipolar transistor corresponds to collector of the npn bipolar transistor. This structure forms a four-layer diode having the layer sequence pnpn as in a thyristor. Given a positive bias of the semiconductor substrate, the pn-junction between the third and fourth semiconductor layers can be biased to such an extent in conducting direction that a current path arises between the said transistor terminals, this current path to be attributed to a parasitic thyristor effect within this four-layer structure. The current path also continues to be present after the dismantling of the positive substrate bias and can thermally overload the integrated circuit.

The latch-up effect is described in the textbook Halbleiterelektronik 14, H. Weiss, K. Horninger, "Integrierte MOS-Schaltungen", pages 109–112. FIG. 3.6 on page 109 shows a complementary transistor pair in solid silicon with respect thereto, whereby FIG. 3.7c additionally illustrates the parasitic, lateral and vertical bipolar transistors that are of critical significance for the latch-up effect.

Previous attempts have been made in three different ways to diminish the latch-up problem of those regions in an integrated circuit that are especially affected by this effect such as, for example, data outputs and output stages. First, an attempt was made to boost the potential of the well-shaped semiconductor zone in CMOS output stages; this means that the potential of the well-shaped semiconductor zone that, for example, is n-doped, is boosted via the supply voltage $V_{DD}$. In this first solution, the well-shaped semiconductor zone is thus connected to a fixed potential that must be delivered by an additional well bias generator or that must be externally applied via an additional terminal. The second solution provides for the employment of pure NMOS output stages, whereby an additional well bias generator is not required as in the first solution. An attempt is thereby made with the assistance of a substrate bias at the semiconductor substrate to exclude the possibility of a latch-up during the operation of the integrated circuit. A third solution derives from the employment of a floating well-shaped semiconductor zone as described in the publication by H. P. Zappe et al, " Floating well CMOS and Latch-Up", IEDM 85, pages 517–520, 9 Dec. 1985. In this case, the well-shaped semiconductor zone is connected to the "outside world" only via the parasitic source-drain pn-junctions of the MOS transistor lying in the well-shaped semiconductor zone, as a result whereof no base current can flow through the parasitic, vertical bipolar transistor.

This latter solution causes the disadvantage that the MOS transistor parameters deteriorate, the stray currents via the well-shaped semiconductor zone increase and the holding voltage of the parasitic pnpn-junction is reduced. Unsatisfactory circuit properties derive due to the employment of pure NMOS output stages, for example in terms of the switching speed, as do level problems in the high status of the output signal. The latter can in fact be avoided by boosting the output signal; this, however, in turn requires additional outlay and increased space requirements. The additional wiring needed as well as an additional space requirement for the generator speak against the possibility of diminishing a latch-up with the first solution with the assistance of a well bias generator.

SUMMARY OF THE INVENTION

The object of the invention is to specify a circuit of the species initially cited wherein the appearance of latch-up effects is largely avoided. This is inventively achieved by a fashioning of the circuit according to the characterizing part of patent claim 1.

Patent claims 2 through 7 are directed to preferred developments and improvements of the invention.

The advantage obtainable with the invention is particularly comprised therein that the circuit of the invention does not influence the circuit properties of the MOS transistors and the circuit of the invention is suitable both for well-shaped semiconductor zones having a fixed potential as well as for well-shaped semiconductor zones having a variable potential. Further, the space requirement for the circuit of the invention is extremely low since only one additional circuit element is required for it.

BRIEF DESCRIPTION OF THE DRAWINGS

Two exemplary embodiments of the invention as well as a possible realization thereof are shown in FIGS. 2, 4 and 5 of the drawing and shall be set forth in greater detail below. Shown are.

DESCRIPTION OF THE PREFERRED EMBODIMENT

Figure 1:
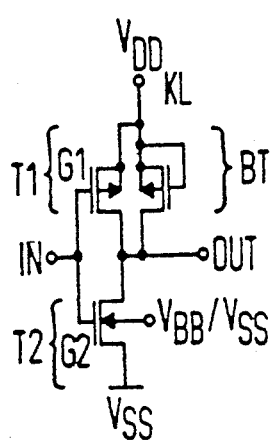
FIG. 1 an equivalent circuit diagram of an output stage having bypass transistor.

FIG. 1 shows the equivalent circuit diagram of a CMOS output stage having a bypass transistor BT. An existing post KL is thereby wired with the supply voltage $V_{DD}$. The CMOS output stage contains two series-connected, complementary field effect transistors T1 and T2, whereby the p-channel field effect transistor T1 has its source and substrate terminal applied to the supply voltage $V_{DD}$ and the n-channel field effect transistor T2 has its source terminal connected to the ground $V_{ss}$. The gate terminals G1, G2 of the p-channel field effect transistor T1 and of the n-channel field effect transistor T2 together form the input IN of the CMOS output stage, whereas the drain terminals of the p-channel field effect transistor T1 and of the n-channel field effect transistor T2 are connected to the output OUT. The substrate terminal of the n-channel field effect transistor T2 can be optionally connected to a substrate bias or to the ground $V_{DD}/V_{ss}$.

That part of the CMOS output stage critical to the invention is directed to the incorporation of the bypass transistor BT that forwards the positive over-voltages from the output OUT onto the supply voltage $V_{DD}$. To this end, the source, substrate and gate terminals of the p-channel bypass transistor BT are connected to the supply voltage $V_{DD}$ and the drain terminal is connected to the output OUT. The bypass transistor BT inhibits during normal operation when no over-voltages appear. When positive over-voltages are adjacent at the output OUT, these being higher than the sum of the supply voltage $V_{DD}$ and the flow voltage of the bypass transistor, the bypass transistor BT becomes conductive and the positive over-voltage at the output OUT is dismantled. The bypass transistor BT thereby sucks up additional charge carriers and thus boosts the trigger current in the parasitic bipolar transistors needed for the appearance of latch-up.

Figure 2:
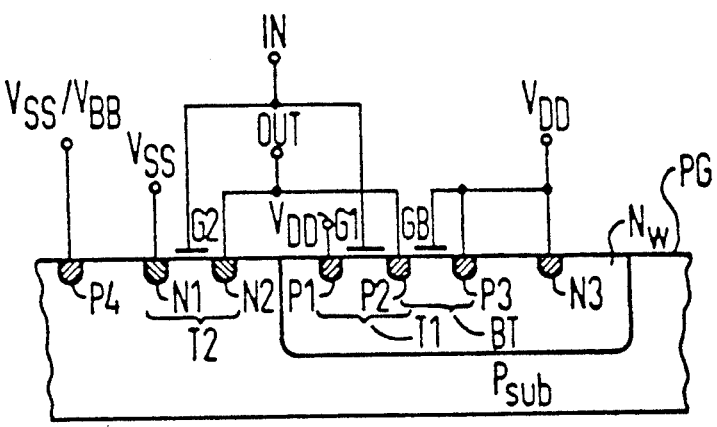
FIG. 2 a cross section through a CMOS output stage having CMOS output transistors, whereby the well-shaped semiconductor zone is connected to a fixed potential.

FIG. 2 shows a cross section relating to the CMOS output stage shown in FIG. 1. An n-conductive, well-shaped semiconductor zone $N_w$ that extends up to the boundary surface PG is inserted within a semiconductor substrate $P_{sub}$ of doped semiconductor material, for example p-conductive silicon. Outside of the well-shaped semiconductor zone $N_w$, n+-doped semiconductor region N1, N2 that form the source and drain region of an n-channel field effect transistor T2 are inserted in the semiconductor substrate, whereas three p+-doped semiconductor regions P1, P2 and P3 that represent the source and drain regions of the p-channel field effect transistor T1 and of the p-channel bypass transistor PT are present within the well-shaped semiconductor zone $N_w$. The p+-doped semiconductor region P1 is used for the source terminal of the p-channel field effect transistor Pl and the p+-doped semiconductor region P3 is used for the source terminal of the p-channel bypass transistor BT; the p+-doped semiconductor region P2 forms the common drain terminal of the p-channel field effect transistor T1 and of the p-channel bypass transistor BT. In the recited example of FIG. 2, the field effect transistors T1 and T2 are constructed as a CMOS output stage, whereby the n+-doped semiconductor region N1 is wired to the ground $V_{ss}$ as source terminal of the n-channel field effect transistor T2 and the n+-doped semiconductor region N2 forms the output OUT of the CMOS output stage and drain terminal of the n-channel field effect transistor T2. The p+-doped semiconductor region P2 is likewise applied to the output OUT, whereas the p+-doped semiconductor region P1 is wired to the supply voltage $V_{DD}$ as source terminal of the same field effect transistor. An input signal for the CMOS output stage is forwarded via the input IN to a first and second gate region G1 and G2 of the first or, respectively, second field effect transistor T1, T2, whereas an output signal can be taken at the output OUT. As indicated in FIG. 2, the p+-doped semiconductor substrate $P_{sub}$ is connected to the ground or to a substrate bias $V_{ss}/V_{BB}$ via an additionally p+-doped semiconductor region P4, whereas the n-conductive well-shaped semiconductor zone $N_w$ is wired to the supply voltage $V_{DD}$ via an n+-doped semiconductor region N3.

That part of the CMOS output stage critical to the invention is represented by the incorporation of the p-channel bypass transistor BT between the output OUT and the supply voltage $V_{DD}$. To this end, the drain terminal of the bypass transistor that is formed by the p+-doped semiconductor region P2 is wired to the output OUT and the source terminal realized by the p+-doped semiconductor region P3 and the gate terminal GB are wired in common to the supply voltage $V_{DD}$. It may seen that the bypass transistor BT can be realized in a relatively simple way with an additional p+-diffusion for the p+-doped semiconductor region P3 and by an additional MOS gate GB. The drain terminal of the bypass transistor BT represents the p+-doped semiconductor region P2 that is likewise utilized as drain terminal for the p-channel field effect transistor T1.

The risk of a latch-up effect in FIG. 2 is always established by the pnpn structure between the n+-conductive semiconductor region N1, the p-doped semiconductor substrate $P_{sub}$, the n-conductive, well-shaped semiconductor zone $N_w$ and the p+-doped semiconductor region P2 whenever one of the pn-junctions is polarized in conducting direction. In this case, the pnpn structure that is similar to a four-layer diode can be ignited as in the case of a thyristor. Such a high current then flows via the pn-junctions that either the junctions or the leads fuse, this potentially leading to a destruction of the CMOS output stage. Due to the incorporation of the additional p-channel bypass transistor BT, positive over-voltage that appears at the output OUT and are adjacent at the p+-doped semiconductor region P2 is always carried off to the supply voltage $V_{DD}$ via the p-channel bypass transistor BT whenever the size of the over-voltage exceeds the sum of the supply voltage $V_{DD}$ and the conducting-state voltage of the bypass transistor. As already mentioned in FIG. 1, the bypass transistor BT suctions off the additional charge carriers and thus increases the trigger current needed for the appearance of latch-up effects. What is thereby important is that the bypass transistor BT has a conducting-state voltage that is lower than the conducting-state voltage of the pn-junctions of the p-channel field effect transistor T1.

Figure 3:
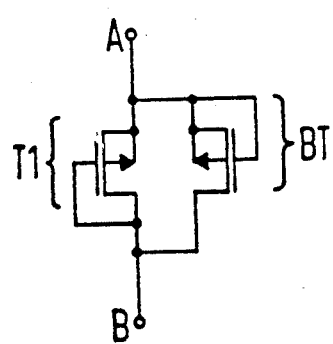
FIG. 3 an equivalent circuit diagram of a pn-channel MOS transistor wired as diode or as load element and having a bypass transistor.

The bypass transistor BT is particularly suited for reducing the latch-up risk when the n-conductive, well-shaped semiconductor zone $N_w$ of a p-channel MOS transistor wired as load element or as diode does not lie at a first potential, for example at the supply voltage $V_{DD}$, but at variable potential for circuit-oriented reasons. FIG. 3 shows an equivalent circuit diagram of a MOS transistor T1 wired in this way. A p-channel bypass transistor BT is connected parallel in FIG. 3 to the p-channel field effect transistor T1 wired between the posts A and B. To this end, a first terminal as well as the substrate terminal of the p-channel field effect transistor T1 and the gate region and a first terminal of the p-channel bypass transistor BT as well as the substrate terminal thereof are connected to the post A and a second terminal and the gate terminal of the p-channel field effect transistor T1 and a second terminal of the bypass transistor BT are connected to the post B. In normal operation, the post A lies at a positive potential and the post B lies at a negative potential. A parasitic, vertical bipolar transistor can thereby not be activated and lead to a latch-up. When the post B receives a more positive potential than the post A given disturbances or when switching other circuit elements of the integrated circuit, then the appearance of latch-up is always unavoidable when the post B has a potential that is greater than the sum of the potential at the post A and the conducting-state voltage of the pn-junction of the p-channel field effect transistor T1 (approximately 0.7 volts). Due to the additional incorporation of the bypass transistor BT, this becomes conductive when the voltage at the post B becomes greater than the sum of the conducting-state voltage of the bypass transistor and the voltage at the post A. In this case, the post A is connected to the post B in low-impedance fashion. The triggering of latch-up due to an activation of a vertical parasitic bipolar transistor is thus made more difficult.

Figure 4:
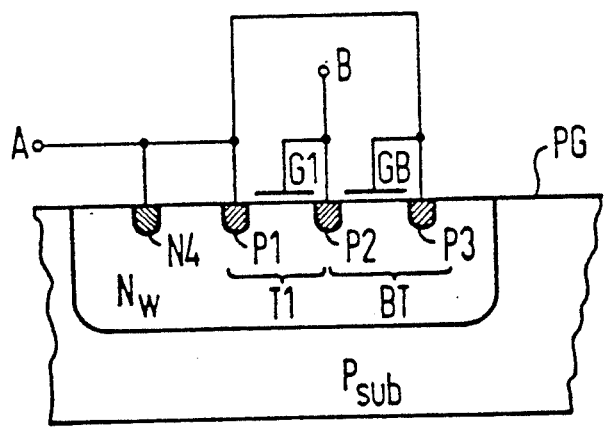
FIG. 4 a cross section through a p-channel MOS transistor wired as diode or as load element and having a bypass transistor, whereby the well-shaped semiconductor zone is not connected to a fixed potential.

FIG. 4 shows a realization of the equivalent circuit diagram recited in FIG. 3. Differing from FIG. 2, the n-conductive, well-shaped semiconductor zone $N_w$ that is embedded within the p+-doped semiconductor zone $P_{sub}$ is not connected to a fixed potential but to a variable potential at the post A via the n+-doped semiconductor region N4.

Just as in FIG. 2, the conductive, well-shaped semiconductor zone $N_w$ extends up to the boundary surface PG and contains the p-channel field effect transistor T1 as well as the p-channel bypass transistor BT connected parallel thereto. The p-channel field effect transistor T1 is constructed of the two p+-doped semiconductor regions P1 and P2 as well as of the gate region G1, whereby the p+-doped semiconductor region P1 that represents a first terminal of the p-channel field effect transistor T1 is connected to the post A and the p+-doped semiconductor region P2 that represents the second terminal of the p-channel field effect transistor T1 is connected to the gate region G1 at the post B. The bypass transistor connected parallel is realized with the assistance of the p+-doped semiconductor region P2 and P3 as well as with the gate region GB, whereby the p+-doped semiconductor region P3 represents the first terminal of the bypass transistor and is connected to the gate region GB and to the post A and the p+-doped semiconductor region P2 represents the second terminal of the bypass transistor. The p+-doped semiconductor region P2 thus fulfills a double function. First, it represents the second terminal of the p-channel field effect transistor T1 and, second, it forms the second terminal of the p-channel bypass transistor BT. An especially simple realization of the bypass transistor, as already mentioned in the description of FIG. 2, is thereby guaranteed in that only an additional p+-diffusion for the p+-doped semiconductor region P3 and an additional gate region GB need be constructed for the bypass transistor.

Figure 5:
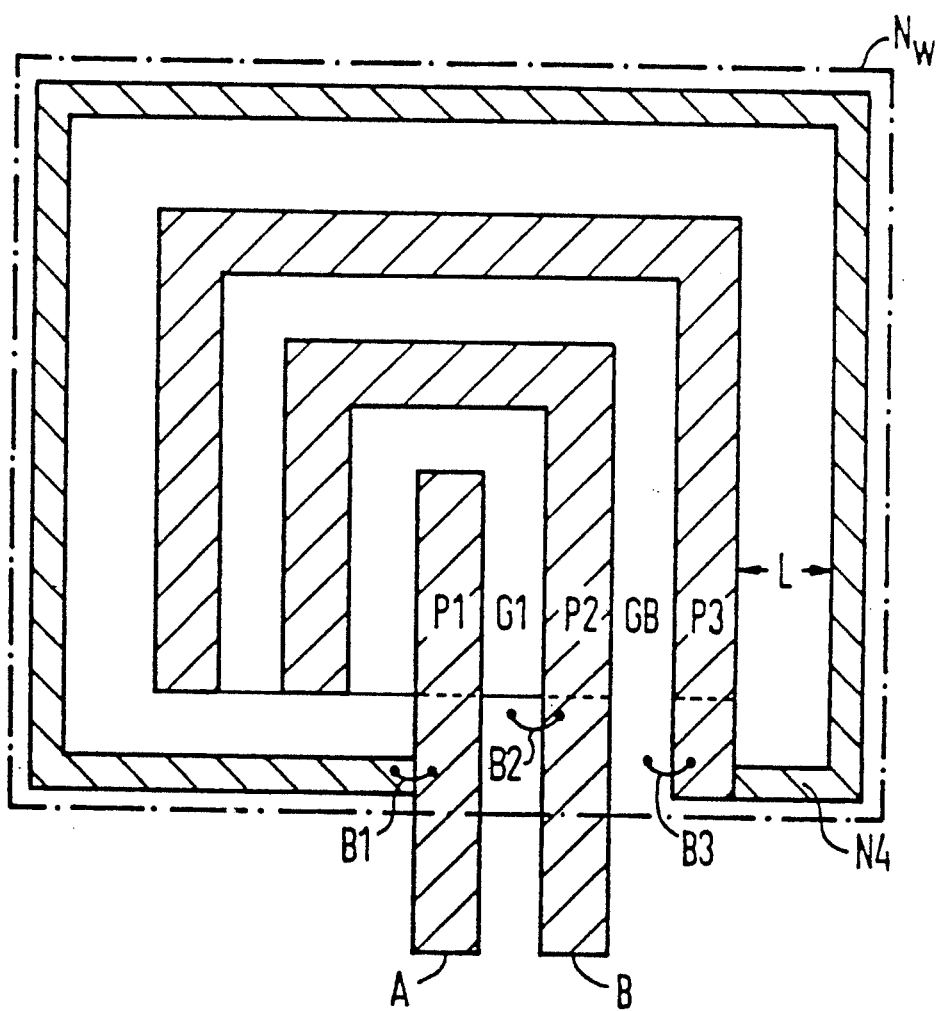
FIG. 5 a realization of a p-channel MOS transistor wired as diode or as load element and having a bypass transistor which conforms to the circuit recited in FIG. 3 and in FIG. 4.

A realization with a layout of a p-channel MOS transistor T1 wired as diode or load element having a bypass transistor BT based on the circuit recited in FIGS. 3 and 4 is shown in FIG. 5 as a view from above. In order to avoid parasitic lead capacitances, the gate regions G1 and GB as well as the p+-doped semiconductor regions P2 and P3 are arranged U-shaped around the p+-doped semiconductor region P1. The reference characters selected in FIG. 3 and in FIG. 4 are likewise employed in FIG. 5 in order to show where the details of the p-channel MOS transistor T1 and of the p-channel bypass transistor BT of FIG. 3 and of FIG. 4 are arranged in the layout of FIG. 5. Recognizable from the plan view of FIG. 5 are the p+-doped semiconductor region P1, the gate region G1 and the p+-doped semiconductor region P2 that form the p-channel MOS transistor T1, whereby the p+-doped semiconductor region P2 in common with the gate region GB and the p+-doped semiconductor region P3 as well represent the p-channel bypass transistor BT. According to FIG. 5, the p+-doped semiconductor region P1 that is employed as first terminal of the p-channel field effect transistor T1 is constructed stripe-shaped and is connected to the post A. The gate region G1 belonging to the p-channel field effect transistor T1 as well as the second terminal of the field effect transistor T1 that is illustrated by the p+-doped semiconductor region P2 are respectively arranged U-shaped around the p+-doped semiconductor region P1. The second terminal of the p-channel field effect transistor T1 is thereby connected to the post B and is connected to the gate region G1 via an electrical connection B2. The U-shaped arrangement of the gate region G1 and of the p+-doped semiconductor region P2 is fashioned such that the gate region G1 is first arranged around the p+-doped semiconductor region P1 and the p+-doped semiconductor region P2 lies around the gate region G1, whereby the gate region G1 is arranged above an imaginary plane erected through the p+-doped semiconductor regions P1, P2 and P3 and is separated from the p+-doped semiconductor region P1 and P2 by a thin insulating layer. The gate region GB is constructed around the p+-doped semiconductor region P2 that is used as second terminal for the p-channel field effect transistor T1 and for the p-channel bypass transistor BT and the p+-doped semiconductor region P3 is constructed around the gate region GB. For example, polysilicon can be employed as gate material for both gate regions G1 and GB. The p+-doped semiconductor region P3 which also represents the first terminal of the p-channel bypass transistor BT is connected to the gate region GB of the p-channel bypass transistor BT via a further electrical connection B3. The gate region GB is again arranged over an imaginary plane erected through the p+-doped semiconductor regions P1, P2 and P3 and is separated from the p+-doped semiconductor regions P2 and P3 by a thin insulating layer. The illustration of FIG. 5 also shows that the n+-doped semiconductor region N4 is arranged stripe-shaped around the p+-doped semiconductor region P3 at a freely selectable distance L therefrom and is connected to the post A via an electrical connection B1. According to FIG. 4, the n+-doped semiconductor region N4 represents an electrical contact to the n-doped, well-shaped semiconductor zone $N_w$ that is shown in FIG. 5 with broken lines outside the n+-doped semiconductor zone N4.

In addition to the embodiments set forth above, the invention also covers embodiments wherein an n-conductive substrate is provided with p-conductive, well-shaped semiconductor zones. The conductivity types of all semiconductor parts and the polarizations of all voltages are thereby replaced by their respective opposites.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. Integrated circuit having anti latch-up circuit in complementary MOS circuit technology having a doped semiconductor substrate of a first conductivity type containing a first transistor with a channel of the first conductivity type and having a well-shaped semiconductor zone of a second conductivity type inserted in the doped semiconductor substrate containing a second transistor with a channel of the second conductivity type, the second transistor having a first terminal connected to a post and a second terminal connected to an output of the anti latch-up circuit, comprising the anti latch-up circuit containing a bypass transistor in the well-shaped semiconductor zone with a channel of the second conductivity type; a gate terminal and a first terminal of the bypass transistor connected to the post and a second terminal of the bypass transistor connected to the output of the anti latch-up circuit.

2. Integrated circuit having anti latch-up circuit according to claim 1, wherein the bypass transistor is a p-channel field effect transistor; wherein the doped semiconductor substrate of a first conductivity type is p-doped; wherein the well-shaped semiconductor zone having a second conductivity type is n-doped; and wherein the post and the well-shaped semiconductor zone of a second conductivity type are connected to a supply voltage.

3. Integrated circuit having anti latch-up circuit according to claim 1, wherein the bypass transistor is an n-channel field effect transistor; wherein the doped semiconductor substrate of a first conductivity type is n-doped; wherein the well-shaped semiconductor zone of a second conductivity type is p-doped; and wherein the post and the well-shaped semiconductor zone of a second conductivity type are connected to ground.

4. Integrated circuit having anti latch-up circuit according to claim 1, wherein the bypass transistor is a p-channel field effect transistor; wherein the doped semiconductor substrate of a first conductivity type is p-doped, and the well-shaped semiconductor zone of a second conductivity type is n-doped; and wherein the post and the well-shaped semiconductor zone of a second conductivity type are connected to a variable supply voltage.

5. Integrated circuit having anti latch-up circuit according to claim 1, wherein the bypass transistor is an n-channel field effect transistor; wherein the doped semiconductor substrate of a first conductivity type is n-doped; wherein the well-shaped semiconductor zone of a second conductivity type is p-doped; and wherein the post and the well-shaped semiconductor zone of a second conductivity type are connected to a variable supply voltage.

6. Integrated circuit having anti latch-up circuit according to claim 1, wherein the second terminal of the bypass transistor is realized by a semiconductor region that represents a terminal of a field effect transistor of the integrated circuit.

7. Integrated circuit having anti latch-up circuit according to claim 1, wherein the first terminal of the bypass transistor is realized by a stripe-shaped semiconductor zone of a first conductivity type and the second terminal is realized by a semiconductor zone of a first conductivity type surrounding a stripe-shaped semiconductor zone; wherein a distance that corresponds to the width of a gate of a field effect transistor is present between the stripe-shaped semiconductor zone of a first conductivity type and the semiconductor zone of a first conductivity type; and wherein the gate terminal is constructed with a gate material that is arranged in insulated fashion above the first and second terminal of the bypass transistor.

8. Integrated circuit having anti latch-up circuit in complementary MOS circuit technology having a doped semiconductor substrate of a first conductivity type containing a first transistor with a channel of the first conductivity type and having a well-shaped semiconductor zone of a second conductivity type inserted in the doped semiconductor substrate containing a second transistor with a channel of the second conductivity type, the second transistor having a first terminal connected to a post and a second terminal connected to an output of the anti latch-up circuit, comprising the anti latch-up circuit containing a bypass transistor in the well-shaped semiconductor zone with a channel of the second conductivity type; a gate terminal and a first terminal of the bypass transistor connected to the post and a second terminal of the bypass transistor connected to the output of the anti latch-up circuit, the first terminal being a source terminal and the source terminal, the gate terminal and a substrate of the bypass transistor connected to a supply voltage via the post, the second terminal of the bypass transistor being a drain terminal of the bypass transistor, the drain terminal being connected to the output of the anti latch-up circuit.

* * * * *